(12) United States Patent
Gandhi

(10) Patent No.: US 7,119,640 B2
(45) Date of Patent: Oct. 10, 2006

(54) CHUA'S CIRCUIT AND IT'S USE IN A HYPERCHAOTIC CIRCUIT

(75) Inventor: Gaurav Gandhi, Delhi (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 0 days.

(21) Appl. No.: 11/036,411

(22) Filed: Jan. 14, 2005

(65) Prior Publication Data
US 2005/0242906 A1 Nov. 3, 2005

Related U.S. Application Data

(63) Continuation of application No. 10/985,327, filed on Nov. 10, 2004.

(30) Foreign Application Priority Data
Nov. 10, 2003 (IN) .................. 1382/DEL/2003

(51) Int. Cl.
*H03H 11/00* (2006.01)
(52) U.S. Cl. ...................... 333/216; 333/217
(58) Field of Classification Search ............... 333/216, 333/217
See application file for complete search history.

(56) References Cited

U.S. PATENT DOCUMENTS

| | | | |
|---|---|---|---|
| 3,582,689 A * | 6/1971 | Smith et al. ................. 327/574 |
| 3,619,798 A * | 11/1971 | Smith et al. ................. 330/9 |
| 4,030,043 A * | 6/1977 | Hamilton ................. 330/260 |
| 4,983,930 A * | 1/1991 | Wadsworth ................. 330/288 |
| 5,596,289 A * | 1/1997 | Liu ................. 327/67 |
| 5,640,120 A * | 6/1997 | Wiest et al. ................. 327/334 |
| 6,047,276 A * | 4/2000 | Manganaro et al. ........... 706/17 |

FOREIGN PATENT DOCUMENTS

WO   WO 94/28626   * 8/1994

OTHER PUBLICATIONS

Toshio Ono, "A switched capacitor inductance simulation circuit realized with a current conveyor", IEEE 1990, pp. 2213-2215.*

(Continued)

*Primary Examiner*—Benny Lee
*Assistant Examiner*—Kimberly E Glenn
(74) *Attorney, Agent, or Firm*—Lisa K. Jorgenson; Allen, Dyer, Doppelt, Milbrath & GilChrist P.A.

(57) ABSTRACT

The present invention provides an improved Chua's circuit providing current mode operation, access to all state variables, minimum use of grounded passive elements, and freedom from passive component matching comprising a dual output current conveyer based inductor having one grounded terminal, a capacitor connected across the second terminal of said inductor, a resistor having one terminal connected to the second terminal of said inductor, the second terminal of said resistor connected to one terminal of a second capacitor the other end of which is grounded, and a pair of dual output current conveyers connected together to form a 2-terminal negative resistance having one terminal connected to ground and the second terminal connected to the second terminal of said resistance.

16 Claims, 17 Drawing Sheets

OTHER PUBLICATIONS

Kiranon et al, "Floating inductance simulation based on current conveyors", Electronics Letters, Oct. 9, 1997, vol. 33 No. 21 pp. 1748-1749.*

P. V. Ananda Mohan, "Grounded capacitor based grounded and floating inductance simulation using current conveyors", Electronics Letters, May 28, 1998, vol. 34, No. 11 pp. 1037-1038.*

Ferri et al "High valued passive element simulation using low voltage low power current conveyor for fully integrated application" IEEE Transaction on Circuit and Systems -ll , vol. 48 No. 4 Apr. 2001, pp. 405-409.*

Ferri et al, "Low voltage low power novel CCII topologies and applications", IEEE 2001, pp. 1095-1098.*

* cited by examiner

CHUA'S CIRCUIT AND IT'S USE IN A HYPERCHAOTIC CIRCUIT

RELATED APPLICATION

This application is a continuation of Ser. No. 10/985,327 filed Nov. 10, 2004, the entire disclosure of which is incorporated by reference herein.

FIELD OF THE INVENTION

The invention relates to Chua's circuits, and more particularly, to a Chua's circuit using a Dual Output Current Conveyer (DO-CCII), and to a Chua's circuit using a Multiple Output Current Conveyor (MO-CCII) for generating a hyper-chaotic circuit.

BACKGROUND OF THE INVENTION

FIG. 1 shows a generalized Chua's circuit that has a parallel combination of a capacitor $C_2$, a Chua's diode $NR_1$ connected to an L-C tank circuit that includes a second capacitor $C_1$ connected in parallel with a serially connected inductor $L_1$. In addition, a first voltage $V_1$ is defined across capacitor $C_1$ and a second voltage $V_2$ is defined across capacitor $C_2$ with the positive orientation of voltages $V_1$ and $V_2$ both being at the positive end of the corresponding capacitor. Finally, there is a linear resistor $R_1$ connected between the positive terminals of each capacitor.

In a typical configuration, the non-linear curve is piecewise linear with symmetrical slope discontinuities around the current axis. It satisfies the following equation: $I_R = G_a V_R + (\frac{1}{2})(G_a - G_b) \{|V_R + B_p| - |V_R - B_p|\}$, where $G_a$ and $G_b$ are the slopes of respective linear portions of the piecewise linear current/voltage curve characterizing the nonlinear resistor, and $B_p$ is the absolute value of the two voltage points at which discontinuities in the current/voltage curve lie, as shown in FIG. 2. The circuit has a circuit driving subsystem, an L-C tank circuit, and a response subsystem with a parallel combination of a capacitor and a non-linear resistor interconnected through a resistor.

By choosing values of R, L, $C_{1\ and\ C2}$, the circuit can operate in different operating regions, for example, the double scroll region. Herein, a Chua's circuit can be made that will oscillate chaotically or quasi-periodically. Given a specified physical configuration, a specified initial state specified by $V_1$, $V_2$ and $I_L$, the voltage across the capacitors $C_1$ and $C_2$, and the current through the inductor L, the evolution of the Chua's circuit is deterministic, but chaotic. That is, any Chua's circuit with the same physical parameters and initial conditions will follow the same course of states over time, and this course will repeat itself over a very long period. However, to an observer it looks mainly like noise. Also, such a system's trajectory is sensitive to initial conditions. In addition, the power spectral density function is spread over a wide range of frequencies, with the peak frequency of the fundamental being governed by the L-C tank circuit.

Due to its simple circuitry and ability to demonstrate most well known routes to chaos, a Chua's Circuit and Chua's Oscillator (CC/CO) are an active topic of research in the study of non-linear dynamic circuits and systems. Recently, there has been an increasing interest in designing inductorless Chua's circuits and Chua's oscillators (CC/CO). Moreover, due to its advantages, the attainability of all the three state variables of a CC/CO is also attracting the designers. Simultaneously, literature is also witnessing the shift of analog integrated circuit designs from voltage mode processing to current-mode processing (CMP). A number of chaotic circuits have been implemented using current-mode active building blocks. The Dual-Output Current Conveyor (DO-CCII) is also emerging as a versatile block to implement current-mode circuits.

To improve the performance of the circuit, different researchers have done extensive research. A paper by Kennedy M. P. (Kennedy M. P., 'Robust op-amp realization of Chua's circuit', Frequenz, 1992, 46, pp. 66–80) suggests a Chua's circuit using off the shelf components. Further, in another research paper by Torres, L. A. B. and Aguirre, L. A. (Torres, L. A. B. and Aguirre, L. A., Inductorless Chua's circuit, Electron. Lett., 2000, 36, (23), pp. 1915–1916) report a Chua's circuit using an operational amplifier to generate a Chua's oscillation at a very low frequency for bio-medical operations.

In a design proposed by Morgul, 0. (Morgul, O., 'Inductorless realization of Chua's oscillator', Electron. Lett., 1995, 31, pp. 1403–1404) synthetic inductors using op-amps were used along with the operational amplifier, thereby making the design suitable for monolithic implementation.

Senani R. and Gupta S. S. (Senani R. and Gupta S. S., 'Implementation of Chua's chaotic circuit using current feedback op-amps', Electron. Lett., 1998, 34, (9), pp. 829–830) proposed a Chua's circuit using a Current Feedback Operational Amplifier (CFOA), thus making available the third state variable through the inductor $(i_L)$.

In another architecture designed by Elwakil A. S. and Kennedy M. P. (Elwakil A. S. and Kennedy M. P., 'Improved implementation of Chua's chaotic oscillator using current-feedback op-amp.', IEEE Trans. CAS-I, 2000, 47, (1), pp. 76–79) the CFOA was efficiently used in the Chua's circuit to provide a higher bandwidth of the chaotic signal with a buffered output of one state variable.

All the above architectures individually provide advantages of a Chua's circuit, but so far, there is no circuit that simultaneously provides: current mode operation; use of minimum grounded passive elements; availability of all the state variables; availability of two state variables in the form of current which can be used to further generate other complex chaotic circuits; a circuit free from passive component matching; use of lesser active components as compared to that represented by FIG. 2; and generation of a reduced hardware higher order chaotic circuit (also called a hyper-chaotic circuit) using one of the available currents mentioned above. Thus, there is a need to develop a circuit that can provide all of these simultaneously.

A Chua's circuit, apart from being a device for demonstrating, studying and modeling a chaotic real world system, has been proposed to generate a hyper-chaotic circuit (T. Kapitaniak, L. O. Chua and G. Zhong, 'Experimental Hyperchaos in Coupled Chua's Circuits', IEEE Trans. CAS-I, Vol 41, No.7, July 1994). Referring to FIG. 3, it has been shown in (T. Kapitaniak, L. O. Chua and G. Zhong, 'Experimental Hyperchaos in Coupled Chua's Circuits', IEEE Trans. CAS-I, Vol 41, No.7, July 1994) that a Chua's circuit (100) may be coupled to a similar Chua's circuit (101) such that the non-grounded terminal of the inductor is connected to the input of a voltage buffer (10) whose output is connected to one of the terminals of a controlling resistor (11), and another end of the controlling resistor is connected to the non-grounded terminal of another Chua's circuit (101). The system coupling is achieved by interconnecting n Chua's circuit in the fashion described above, and the last Chua's circuit of the ring is either connected to the first Chua's circuit (100) or is left open. This type of coupling results in the following cases:

For the value of the controlling resistor greater than a specific value (called a threshold value), all the Chua's circuits will synchronize with each other. This value of the controlling resistor depends on the number of Chua's circuits used in the chain. During this state, the curve between the state variable of one Chua's circuit to the corresponding state variable in another Chua's circuit of the chain will be a straight line.

If the value of the controlling resistor is less than the specific value (called a threshold value), the Chua's circuits will loose synchronization with each other and the system will undergo a state of hyper-chaos, which is more sensitive to the initial condition. This value of the controlling resistor depends on the number of Chua's circuits used in the chain. During this state the curve between the state variable of one Chua's circuit to the corresponding state variable in another Chua's circuit of the chain will not be a straight line.

With such a proposal, a monolithic implementation of the hyper-chaotic circuit can be achieved by using any of the above-mentioned variations of the Chua's circuit (i.e., prior art Chua's circuits can be used to generate the hyper-chaotic circuit using the above described scheme). However, the use of any of these circuits will not only add to the disadvantage of those proposed Chua's circuits, but also one voltage buffer and one floating resistor per coupling is required, which in turn, makes the final circuit bulky and inefficient in terms of power consumption.

SUMMARY OF THE INVENTION

An object of the invention is to prevent the above drawbacks associated with prior art Chua's circuits.

Another object of the invention to design a Chua's circuit using four Dual Output Current Conveyors (DO-CCII), two grounded resistors, three grounded capacitors and three floating resistors.

Yet another object of the invention is to use a minimum number of grounded elements as compared to those used in the prior art.

A further object of the invention is to have voltage across the inductor in the form of current for current mode processing of the system without any extra hardware requirement.

Another object of the invention is to derive a Chua's diode using two grounded resistors, two floating resistors and two MO-CCIIs.

Yet another object of the invention is to derive a Chua's diode using two grounded resistors, two floating resistors and two DO-CCIIs.

A further object of the invention is to achieve current through the z-terminal of a DO-CCII and a MO-CCII used in designing non-linear resistors.

Yet another object of the invention is to design a Chua's circuit using a Multiple Output Current Conveyor.

A further object of the invention is to achieve a grounded controlling resistor for a hyper-chaotic system designed by the coupling of a Chua's circuit, which is done by using the above derived current of the voltage across an inductor.

According to one embodiment, an improved Chua's circuit is provided based upon another embodiment. The CCII presented in (Seguin F. and Fabre A., 'New second generation current conveyor with reduced parasitic resistance and band-pass filter application', IEEE Trans. CAS-I, 2001, 48,(6), pp. 781–785) is modified to achieve a DO-CCII and a MO-CCII as shown in FIG. 4. The schematic diagram of the MO-CCII and DOCCII used to further design the Chua's chaotic circuit and its coupling is shown in FIGS. 6A and 6B.

According to another embodiment, the above DO-CCII based Chua's circuit can be implemented using a MO-CCII based Chua's circuit, as shown in FIG. 5.

To achieve the above objectives, the present invention provides an improved Chua's circuit providing current mode operation, access to all state variables, minimum use of grounded passive elements, and freedom from passive component matching. The Chua's circuit comprises a multiple output current conveyer based inductor having one grounded terminal, a capacitor connected across the second terminal of the inductor, and a resistor having one terminal connected to the second terminal of the inductor. The second terminal of the resistor may be connected to one terminal of a second capacitor. The other end of the second capacitor may be grounded. A pair of multiple output current conveyers may be connected together to form a 2-terminal negative resistance having one terminal connected to ground and the second terminal connected to the second terminal of the resistance. The multiple output current conveyers may be the multiple output (second generation) current conveyers (MO-CCII).

The inductor comprises two multiple output current conveyers having their x terminals grounded through resistors, a capacitor having one terminal grounded and its second terminal connected to the terminal $z_{P_1}$ of the second multiple output current conveyer, and in parallel to the y terminal of the first multiple output current conveyer. The y terminal of the second multiple output current conveyers and the terminal $z_{N1}$ of the first multiple output current conveyers are joined together, which acts as one of the terminals of a simulated grounded inductance.

The 2-terminal negative resistance circuit comprises two multiple output current conveyers having their x terminals grounded through resistors, and their y terminals connected together and to the terminals $z_{P1}$ of both the multiple output current conveyers through two different resistors.

An improved Chua's circuit may provide current mode operation, access to all state variables, minimum use of grounded passive elements, and freedom from passive component matching. The Chua's circuit comprises a dual output current conveyer based inductor having one grounded terminal, a capacitor connected across the second terminal of the inductor, and a resistor having one terminal connected to the second terminal of the inductor. The second terminal of the resistor may be connected to one terminal of a second capacitor, the other end of which is grounded. A pair of dual output current conveyers may be connected together to form a 2-terminal negative resistance having one terminal connected to ground, and the second terminal connected to the second terminal of the resistance. The dual output current conveyer may be a dual output (second generation) current conveyer.

The inductor comprises two dual output current conveyers having their x terminals grounded through resistors, a capacitor having one terminal grounded and its second terminal connected to the terminal $z_+$ of the second dual output current conveyer and in parallel to the y terminal of the first dual output current conveyer. This is while the y terminal of the second dual output current conveyers and the terminal $z_-$ of the first dual output current conveyers are joined together, and which acts as one of the terminals of a simulated grounded inductance.

The 2-terminal negative resistance circuit comprises two dual output current conveyers having their x terminals grounded through resistors, and their y terminals connected together and to the terminals $z_+$ of both dual output current conveyers through two different resistors.

An improved Chua's circuit for use in a hyper-chaotic circuit comprising a plurality of the Chua's circuit symmetrically coupled together enables a monolithic implementation of a hyper-chaotic circuit.

A method for improving a Chua's circuit to provide a current mode operation, access to all state variables, minimum use of grounded passive elements, and freedom from passive component matching is provided. The method may comprise the steps of simulating a grounded inductor using a multiple output current conveyer, connecting a capacitor connected across the second terminal of the inductor, and connecting one terminal of a resistor to the second terminal of the inductor. The second terminal of the resistor is connected to one terminal of a second capacitor, the other end of which is grounded. The method further includes providing a 2-terminal negative resistance device using a pair of multiple output current conveyers.

BRIEF DESCRIPTION OF THE DRAWINGS

The invention will now be described with reference to the accompanying drawings.

DETAILED DESCRIPTION OF THE PREFERRED EMBODIMENTS

The invention provides a Chua's circuit using a Dual Output (second-generation) Current Conveyer (DO-CCII) as one embodiment. The invention also provides implementation of a Chua's circuit using a Multiple Output Current Conveyor (MO-CCII), and provides a hyper-chaotic circuit using the Multiple Output Current Conveyor.

Figure 3:
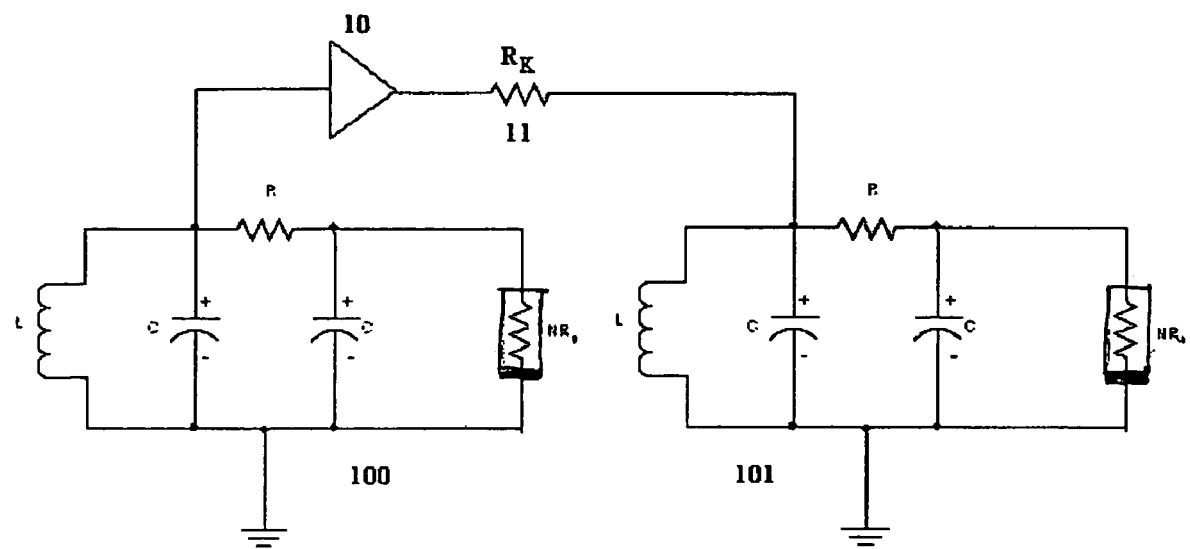
FIG. 3 is a schematic diagram showing the coupling of Chua's circuit according to the prior art.

FIG. 3 shows the coupling of n Chua's circuits to achieve synchronization. The system thus formed is used to solve the following set of equations:

$$C_1 \frac{dv_{C_1}^{(1)}}{dt} = G(v_{C_2}^{(1)} - v_{C_1}^{(1)}) - f(v_{C_1}^{(1)})$$

$$C_2 \frac{dv_{C_2}^{(1)}}{dt} = G(v_{C_1}^{(1)} - v_{C_2}^{(1)}) + i_L^{(1)} + f(v_{C_1}^{(1)}) + \frac{1}{R_K}(v_{C_2}^{(2)} - v_{C_2}^{(1)})$$

$$L\frac{dv_L^{(1)}}{dt} = -v_{C_2}^{(1)}$$

$$C_1 \frac{dv_{C_1}^{(2)}}{dt} = G(v_{C_2}^{(2)} - v_{C_1}^{(2)}) - f(v_{C_1}^{(2)})$$

$$C_2 \frac{dv_{C_2}^{(2)}}{dt} = G(v_{C_1}^{(2)} - v_{C_2}^{(2)}) + i_L^{(2)} + f(v_{C_1}^{(2)}) + \frac{1}{R_K}(v_{C_2}^{(3)} - v_{C_2}^{(2)})$$

$$L\frac{dv_L^{(2)}}{dt} = -v_{C_2}^{(2)}$$

$$\vdots$$

$$C_1 \frac{dv_{C_1}^{(n)}}{dt} = G(v_{C_2}^{(n)} - v_{C_1}^{(n)}) - f(v_{C_1}^{(n)})$$

$$C_2 \frac{dv_{C_2}^{(n)}}{dt} = G(v_{C_1}^{(n)} - v_{C_2}^{(n)}) + i_L^{(n)} + f(v_{C_1}^{(n)}) + \frac{1}{R_K}(v_{C_2}^{(n+1)} - v_{C_2}^{(n)})$$

$$L\frac{dv_L^{(n)}}{dt} = -v_{C_2}^{(n)}$$

The dynamics of the system is dependent on the controlling resistor $R_K$. This aspect has been discussed in the prior art.

Figure 4:
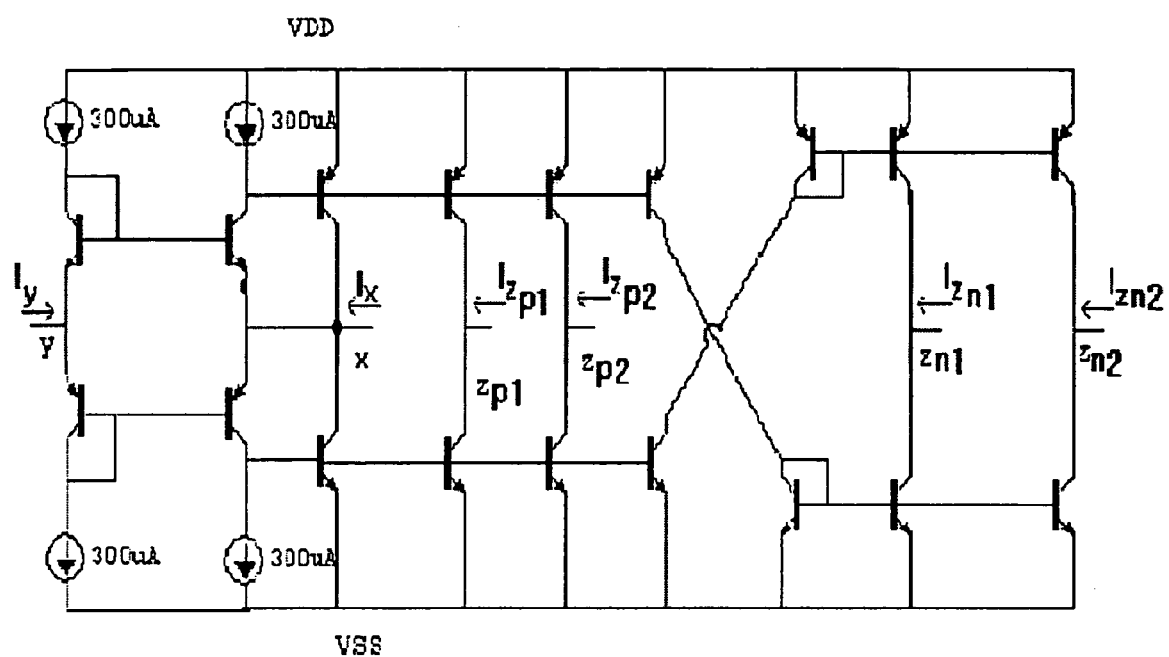
FIG. 4 is a schematic diagram showing implementation of a MO-CCII according to the invention.

FIG. 4 shows the implementation of a Multiple Output Current Conveyor which has been designed by modifying the current conveyor proposed in (Seguin F. and Fabre A., 'New second generation current conveyor with reduced parasitic resistance and band-pass filter application', IEEE Trans. CAS-I, 2001, 48,(6), pp. 781–785). Herein, one additional output terminal z– is taken by using current mirrors. This scheme then corresponds to implementation of a DO-CCII. Further, two additional outputs, one similar in behavior to terminal z+ and one similar in behavior to terminal z– have been added. The final scheme as shown in the figure forms a MO-CCII.

Figure 5:
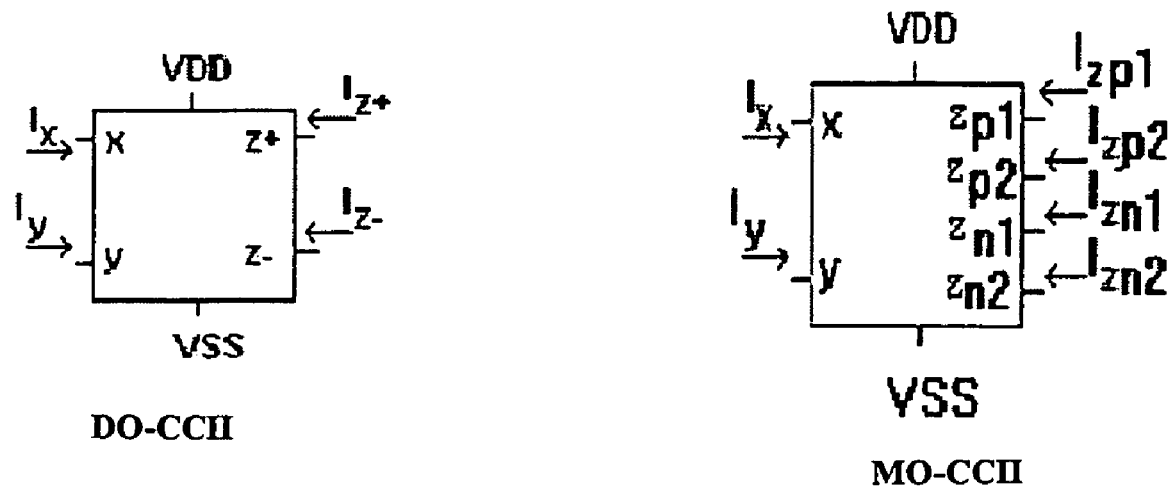
FIG. 5 is block diagrams of a DO-CCII and a MO-CCII according to the invention.

FIG. 5 shows a schematic block diagram of a DO-CCII and a MO-CCII. The DO-CCII has six terminals. Terminals VSS and VDD are the supply voltage terminals while the terminals x, y, z+ and z– allow different voltages and currents to flow in and out of the circuit.

A basic DO-CCII has a current mirror circuit that reflects the current of terminal x in the terminal z+. The magnitude of the current through in the terminal z– and the current through the terminal z+ is the same except for their directions. Also, the voltages at the terminals x and y are the same and the current through the terminal y is zero. This can be represented in the following equations:

$$v_x = v_y \quad (1)$$

$$i_y = 0 \quad (2)$$

$$i_{z+} = i_x \quad (3)$$

$$i_{z-} = -i_x \quad (4)$$

The subscripts with currents I and voltages V represent currents and voltages in the respective terminals of the DO-CCII.

The MO-CCII has eight terminals. Terminals VSS and VDD are the supply voltage terminals while the terminals x, y, zp1, zp2, zn1 and zn2 allow different voltages and currents to flow in and out of the circuit.

A basic MO-CCII has a current mirror circuit that reflects the current of terminal x in the terminal zp1. The magnitude of the current through the terminal zn1 and the current through the terminal zp1 is the same except for their directions. Also, the voltages at the terminals x and y are the same and the current through the terminal y is zero. Further, the terminals zp1 and zp2 show similar behavior in terms of current movement. Similarly, the terminals zn1 and zn2 show similar behavior. This can be represented in following equations:

$$v_X = v_Y \quad (1)$$

$$i_y = 0 \quad (2)$$

$$i_{zp1} = i_x \quad (3)$$

$$i_{zp2} = -i_X \quad (4)$$

$$i_{zn1} = i_X \quad (5)$$

$$i_{zn2} = -i_X \quad (6)$$

The subscript with the currents I and voltages V represent currents and voltages in the respective terminals of the MO-CCII.

Figure 6A:
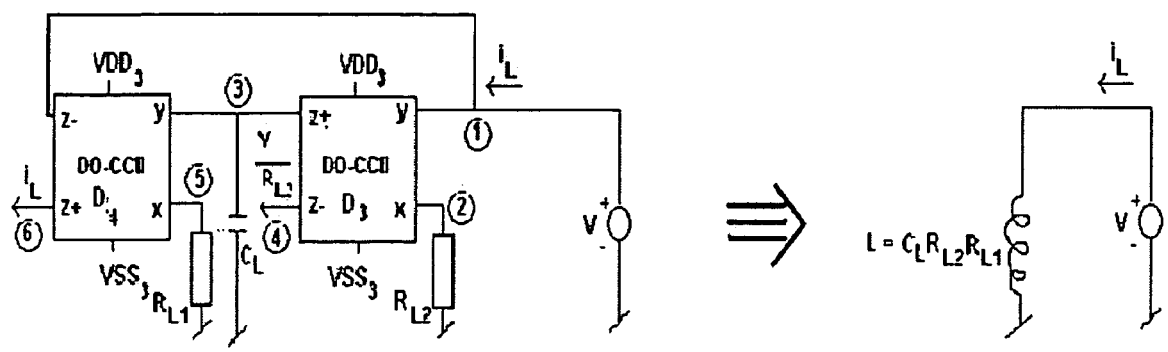
FIG. 6A is a schematic diagram of the DO-CCII based inductor according to the invention.

These characteristics of the DO-CCII and the MO-CCII can be used to form inductive properties as discussed below. FIG. 6A shows a DO-CCII based inductor. This inductor has two DO-CCIIs $D_3$ and $D_4$ having their x terminals grounded through the resistors $R_{L1}$, $R_{L2}$. A capacitor CL has its one terminal grounded and its second terminal coupled to the terminal $z_+$ of the DO-CC II $D_3$ and to the terminal y of the DO-CCII $D_4$. The terminal $z_-$ of $D_4$ and the terminal y of $D_3$ are joined together to connect the one terminal of the input supply.

When a voltage v is applied at node 1, a similar voltage is induced at node 2 that is at the terminal x of $D_3$ according to equation 1 of the DO-CCII. This results in current $i_2$ through the resistor $R_{L2}$ given by $i_2 = v/R_{L2}$.

Because of the relations 3 and 4, current through terminal x is reflected at terminals $z_-$ and $z_+$, accordingly, thus producing a voltage across the capacitor $C_L$ which is seen by the y terminal of D4 and is given by the following:

$$v_3 = \int \frac{v}{C_L R_{L2}} dt$$

The voltage $V_3$ is then induced at the terminal x of $D_4$ according to relation 1, thus causing a current i5 through the resistor $R_{L1}$ that is then reflected in the terminals z+ and z− of D4. The current i5 through the resistor $R_{L1}$ can be given as follows:

$$i_5 = \frac{v_3}{R_{L1}} = \int \frac{v}{C_L R_{L2} R_{L1}} dt$$

Figure 1:
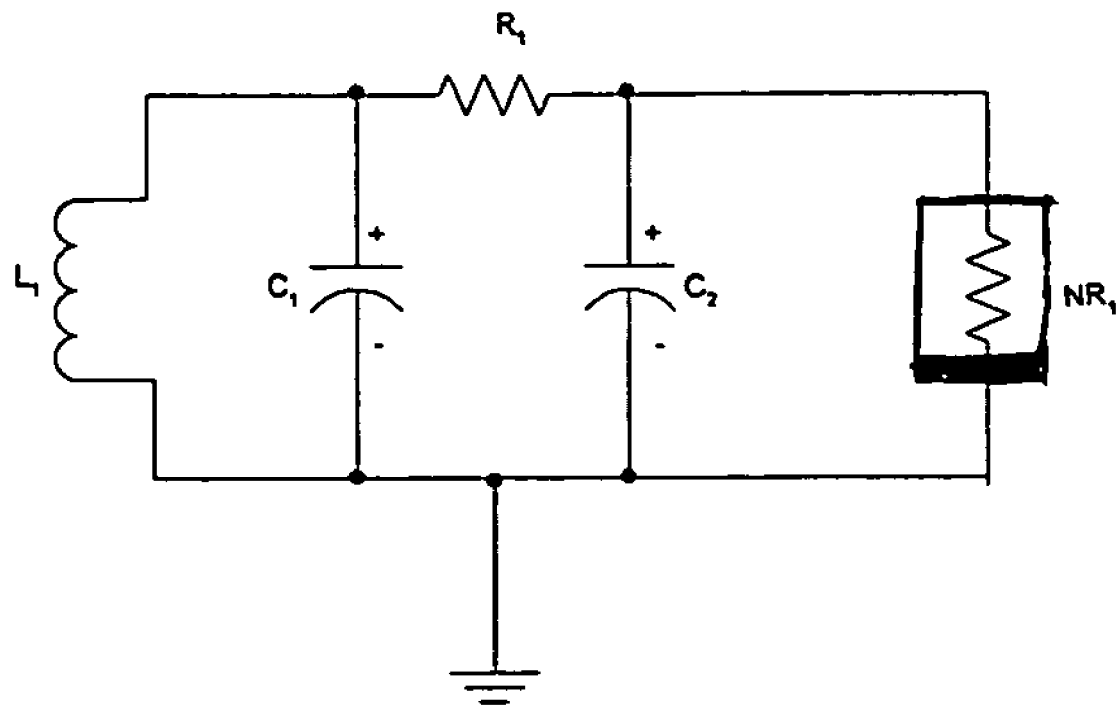
FIG. 1 is a schematic diagram of a generalized Chua's circuit diagram according to the prior art.
Figure 2:
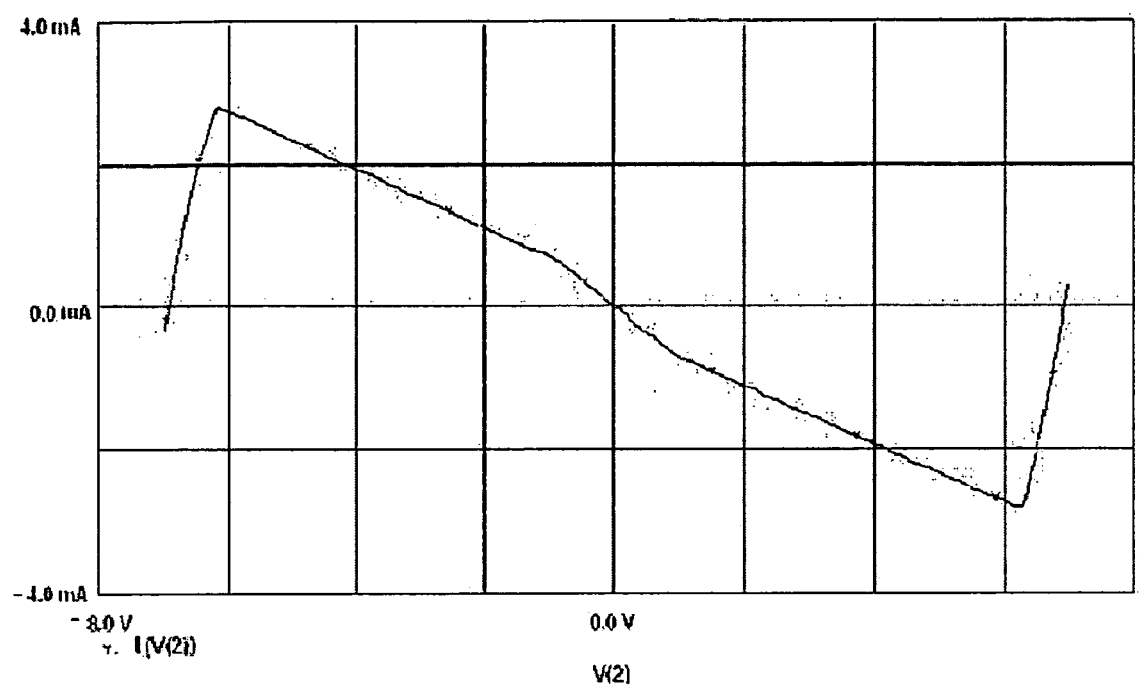
FIG. 2 is a plot showing the response of a non-linear resistor (Chua's diode) according to the prior art.

From FIG. 2 it is clear that the current $i_5 = i_L$ because of relation 2, thus the following equation can be written:

$$i_L = \int \frac{v}{C_L R_{L2} R_{L1}} dt$$

From above, the following equation can be written:

$$C_L R_{L1} R_{L2} \frac{di_L}{dt} = v$$

The characteristic equation of an inductor is given by the following:

$$L \frac{di_L}{dt} = v$$

Upon comparing the above two equations we get the following:

$$L = C_L R_{L1} R_{L2}$$

Thus, it can be said that the circuit shown is FIG. 6A is equivalent to an inductor having a value determined by $L = C_L R_{L1} R_{L2}$. Further, it is important to note that the circuit provides terminals z+ and z− of $D_4$ and $D_3$, respectively, to tap current flowing through the inductor and the voltage across capacitor (of a tank circuit) in the form of current. More specifically, since $D_3$ provides voltage across the capacitor in the form of current, current through the inductor is available at the terminal $z_+$ of D4.

Figure 6B:
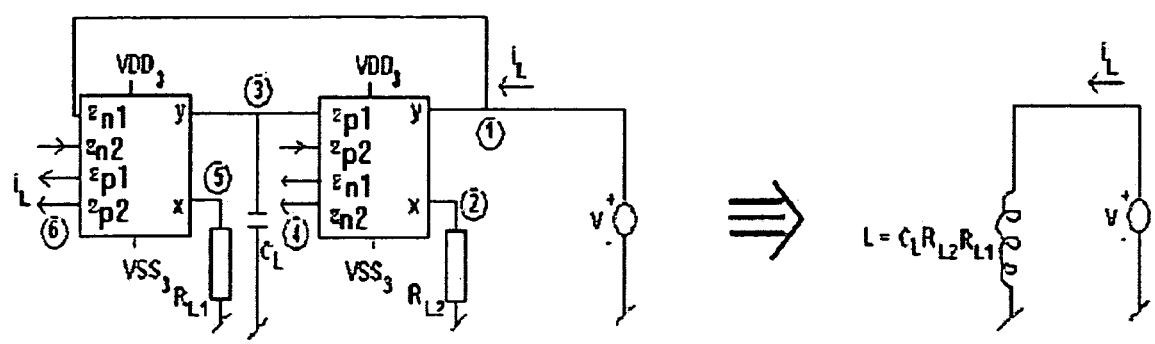
FIG. 6B is a schematic diagram of the MO-CCII based inductor according to the invention.

Similar results can be achieved by using the MO-CCII by replacing terminal x of the DO-CCII by terminal x of the MO-CCII, terminal y of the DO-CCII by terminal y of the MO-CCII, terminal z+ of the DO-CCII by terminal z1+ of the MO-CCII, terminal z− of the DO-CCII by terminal z1− of the MO-CCII, terminal VDD of the DO-CCII by terminal VDD of the MO-CCII, terminal VSS of the DO-CCII by terminal VSS of the MO-CCII, and the rest of the terminals of the MO-CCII, i.e., terminals z2+ and z2− remain floating. Thus, the MO-CCII based inductor is also formed as shown in FIG. 6B.

Figure 7A:
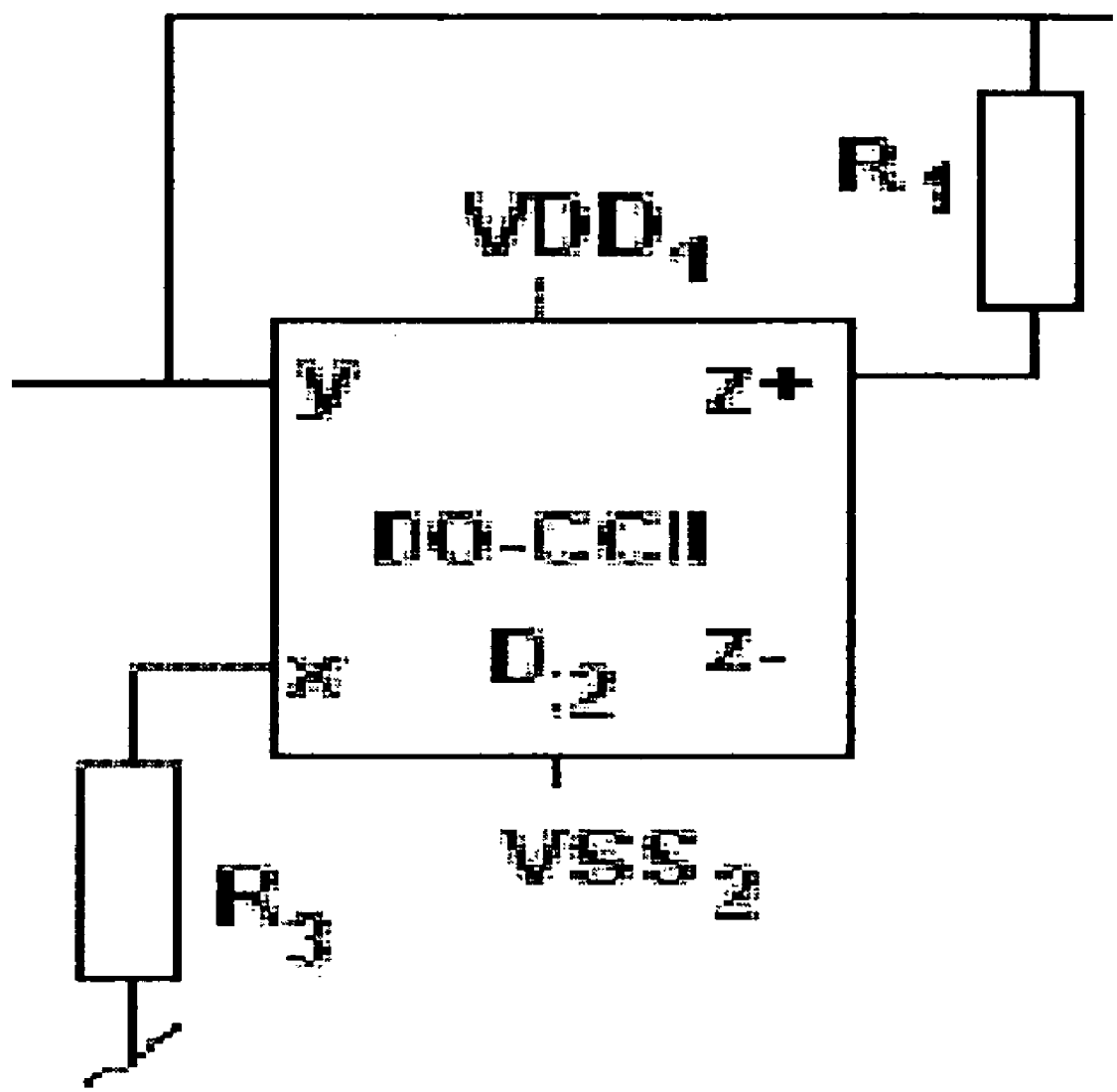
FIG. 7A is a schematic diagram of the DO-CCII based non-linear negative resistor according to the invention.

FIG. 7A shows a schematic block diagram of the DO-CCII based negative resistor. The DO-CCII has the terminal x connected to a resistance R3 whose other terminal is connected to ground and has a resistance R1 connected between its terminals z+ and y.

Figure 8:
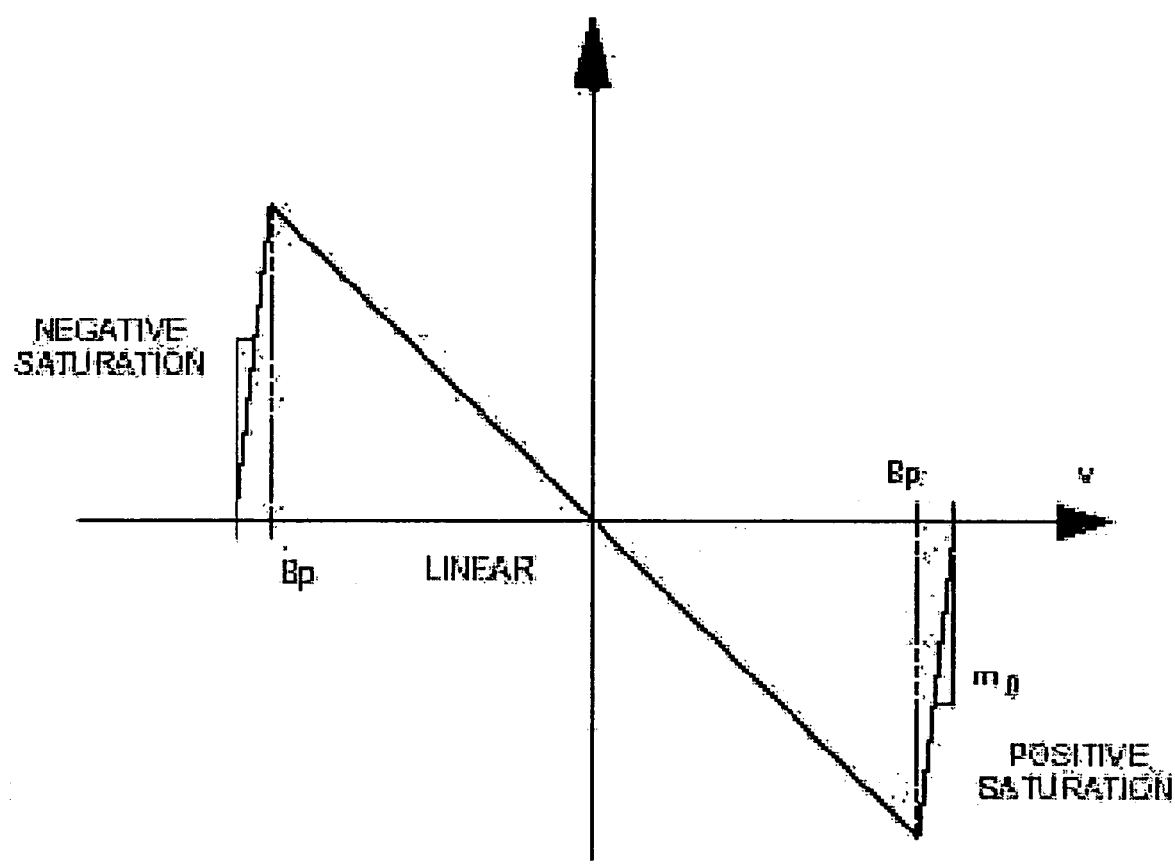
FIG. 8 is a plot showing the characteristic of a non-linear negative resistor according to the invention.

A Dual Output Current Conveyer based non-linear device basically works in three different regions as depicted in the current versus voltage plot shown in FIG. 8. The region of operation can be classified as follows.

A negative saturation region is the region when the input voltage to this non-linear device is highly negative with respect to ground, while the positive saturation region when the input voltage to this non-linear device is highly positive with respect to ground. The input voltage is the voltage applied at the y terminal of the non-linear device described in FIG. 7A. The linear region is when the input voltage to this non-linear device is comparable to the supply voltage.

In the negative or positive saturation regions when the input voltages are either highly negative or positive, the terminal $z_+$ of the DO-CCII assumes a constant voltage (negative or positive, respectively) thus, allowing a current to flow through the resistance R3 exhibiting positive resistive properties beyond a Break point (Bp), as shown in FIG. 8.

In the linear region when the input voltage is comparable to the supply voltage, the current flowing inside the terminal z+equals current through the terminal x according to the relation 3. Also, the voltage at the terminal x and the voltage at the terminal y are similar according to the relation 1 for a DO-CCII. Thus, current through the input supply terminal $i_{in}$ is equal to the current through the resistor R3, and hence, the current $i_x$ through the terminal x. Thus, the voltage at the terminal y can be given as: $v_y = -i_x * R3$ or $i_x/v_y = -1/R3 = m_1$, where $m_1$ is the slope in the linear region.

Due to its linearity in the three regions, positive linearity in the positive and negative saturation regions and negative linearity in the linear region, the non-linear device operates as a non-linear resistor with positive resistance at the positive and negative saturation region and negative resistance in the linear region. Hence, the DO-CCII of FIG. 7A exhibits a negative resistance in the linear region as shown in the corresponding current versus voltage plot in FIG. 8.

Figure 7B:
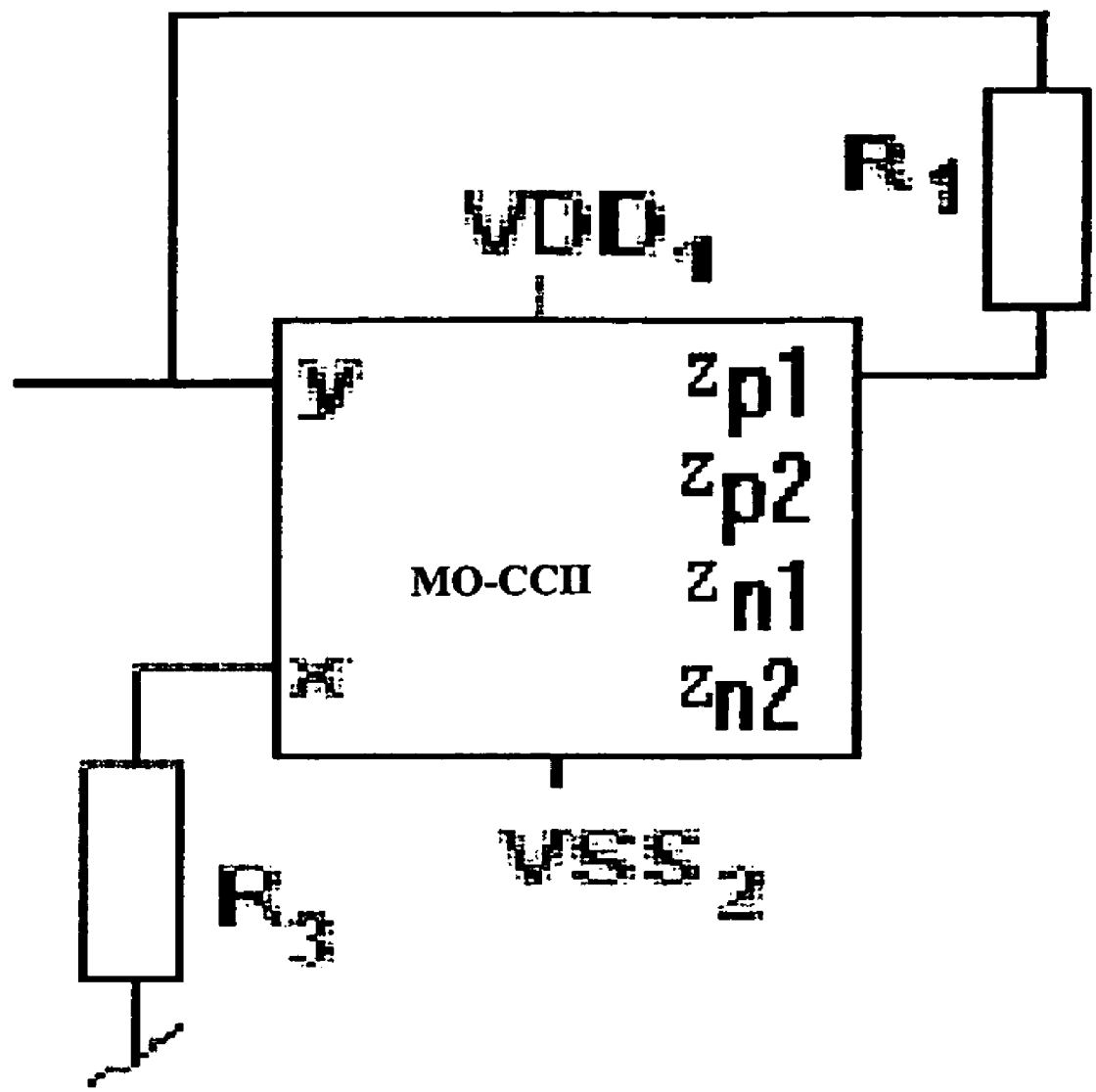
FIG. 7B is a schematic diagram of the MO-CCII based non-linear negative resistor according to the invention.

Similar results can be achieved by using the MO-CCII by replacing terminal x of the DO-CCII by terminal x of the MOCCII, terminal y of the DO-CCII by terminal y of the MO-CCII, terminal z+ of the DO-CCII by terminal zp1 of the MO-CCII, terminal z− of the DO-CCII by terminal zn1 of the MO-CCII, terminal VDD of the DO-CCII by terminal VDD of the MO-CCII, terminal VSS of the DO-CCII by terminal VSS of the MO-CCII, and the rest of the terminals of the MO-CCII, i.e., terminals zp2 and zn2 remain floating. Thus, the MO-CCII based negative resistor is also formed, as shown in FIG. 7B.

Figure 9A:
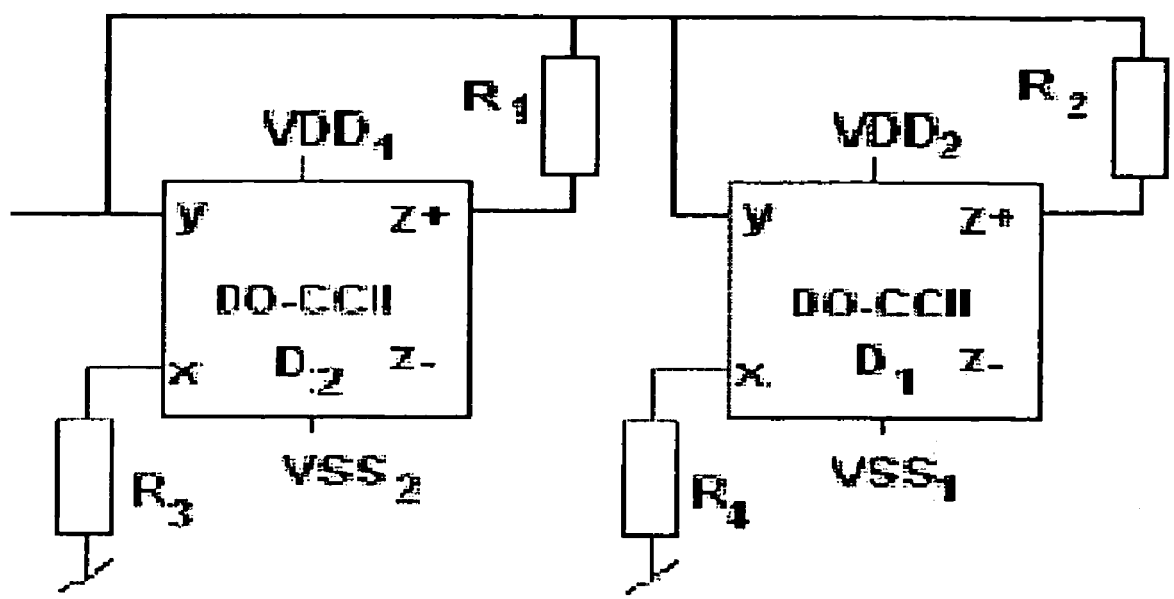
FIG. 9A is a schematic diagram showing implementation of a Chua's diode using the DO-CCII according to the invention.

FIG. 9A shows two DO-CCIIs connected in parallel to achieve a variable slope in the linear region and a specified break point as required for the Chua's circuit. The total conductance of the parallel combination of the two DO-CCIIs is a linear addition of the individual conductance of each DO-CCII. Thus, the I-V characteristics of the parallel combination exhibit a variable slope, as shown in FIG. 2. Note that this type of non-linear resistor is also called a Chua's diode.

Figure 9B:
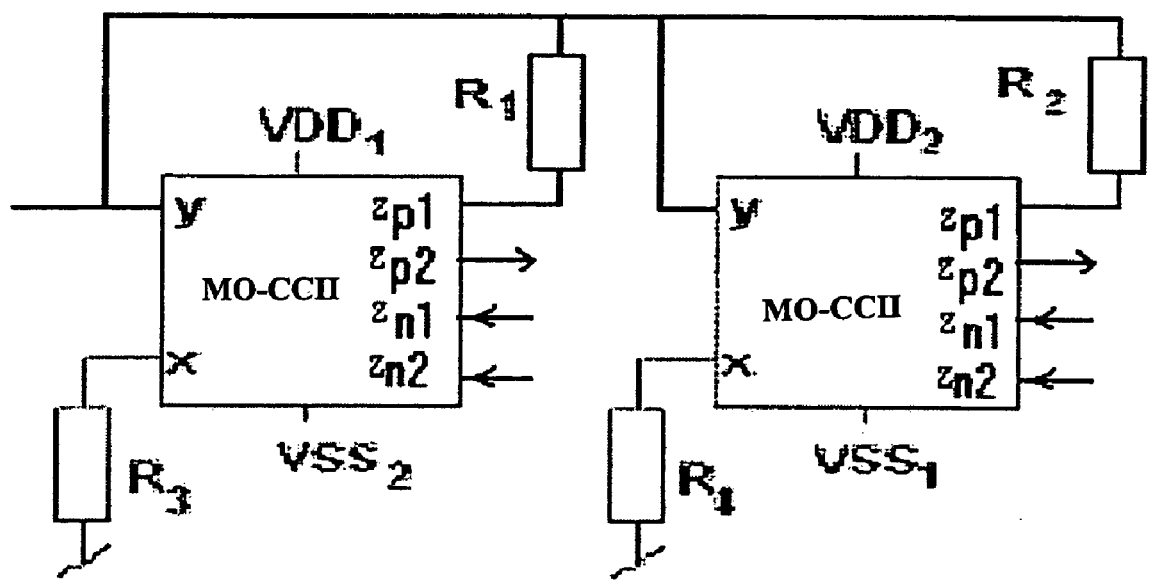
FIG. 9B is a schematic diagram showing implementation of a Chua's diode using the MO-CCII according to the invention.

Similar results can be achieved by using the MO-CCII by replacing terminal x of the DO-CCII by terminal x of the MO-CCII, terminal y of the DO-CCII by terminal y of the MO-CCII, terminal z+ of the DO-CCII by terminal zp1 of the MO-CCII, terminal z− of the DO-CCII by terminal zn1 of the MO-CCII, terminal VDD of the DO-CCII by terminal VDD of the MO-CCII, terminal VSS of the DO-CCII by terminal VSS of the MO-CCII, and the rest of the terminals of the MO-CCII, i.e., terminals zp2 and zn2 remain floating. Thus, the MO-CCII based Chua's diode is also formed, as shown in FIG. 9B.

Without limiting the scope of the invention to the discussed embodiment and the values thereof, the invention will now be discussed with reference to the circuit shown in FIG. 10. A person skilled in art will appreciate that the invention can also be practiced with other embodiments without deviating from the concept described below.

Figure 10:
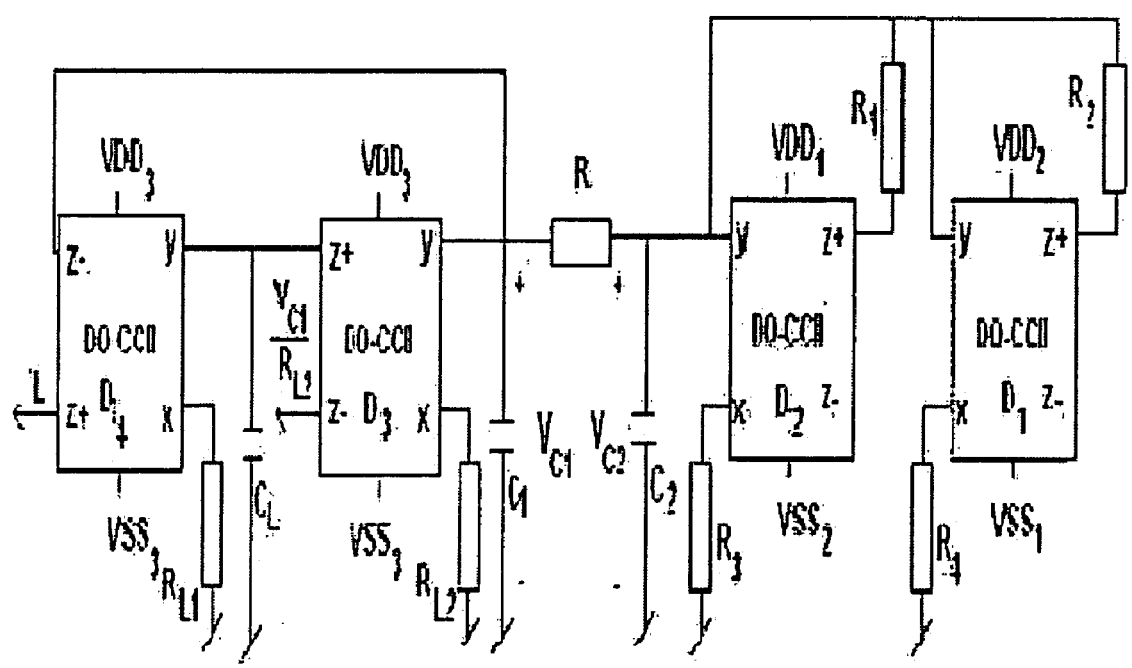
FIG. 10 is a schematic diagram of a Chua's circuit using the DO-CCII according to the invention.

FIG. 10 shows a schematic block diagram of a Chua's circuit according to one embodiment of the invention. The circuit shown is basically a current mode implementation of the Chua's circuit using a Dual Output second generation Current Conveyor. The Chua's chaotic circuit according to the invention comprises four Dual Output Second Generation Current Conveyors D1, D2, D3 and D4. The DO-CCIIS D3 and D4 form an inductor as described in FIG. 6A, and the DO-CCIIS D1, D2 form a non-linear component as described in the FIG. 9A. The capacitors C1 and C2 are the first and second energy storing elements of the Chua's circuit, and are connected to terminals y of D3, D2 respectively. Resistor R is the passive component of the Chua's circuit and is connected to the terminals y of D1 and D2. The terminals y of D1 and D2 are coupled together and the terminals x of D1 and D2 are connected to ground through the resistive loads R4 and R3. The terminals $z^+$ of D1 and D2 are connected to their terminals y through the resistances R1 and R2 and the terminals y of D2 and D1 are connected, as shown in FIG. 9A.

For this Chua's circuit, the equation can be written as follows:

$$C_2 \frac{dV_2}{dt} = \frac{1}{R}(V_1 - V_2) - g(V_1)$$

$$C_1 \frac{dV_1}{dt} = \frac{1}{R}(V_2 - V_1) + i_L$$

where, $$g(V_1) = m_0 V_1 + \frac{1}{2}(m_0 - m_1)[|V_1 + B_p| - |V_1 - B_p|]$$

The value of $m_0$ and $m_1$ are determined by resistor values R1, R2, R3, R4 and the supplies VSS1, VSS2, VDD1, VDD2.

Figure 12:
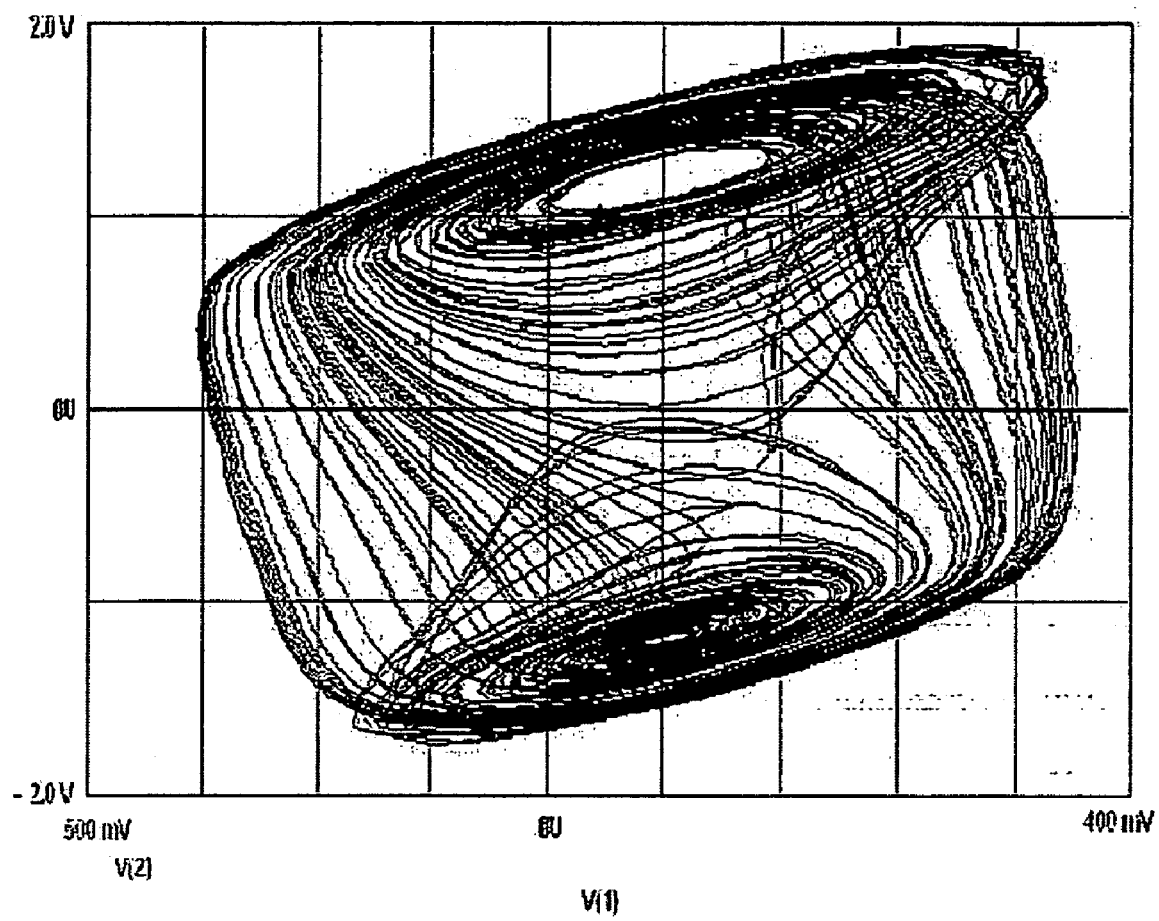
FIG. 12 is a plot showing a Double Scroll attractor derived from the MO-CCII based Chua's Circuit according to the invention.

FIG. 12 shows the results obtained by simulations of the above Chua's circuit for values selected as follows. This is called the double scroll-operating region.

Non Linear resistance:

$R_1$=190 Ω, $R_2$=25.6 kΩ, $R_3$=2 kΩ, $R_4$=2.2 kΩ; and $VSS_1$= −7V, $VDD_1$=7.8V, $VSS_2$=−7.8V, $VDD_2$=7V.

Inductor:

CL=100 nF, $R_{L1}$=400 Ω, $R_{L2}$=400 Ω.

Other components:

$C_1$=100 nF, $C_2$=10 nF, R=1.550 k.

Figure 11:
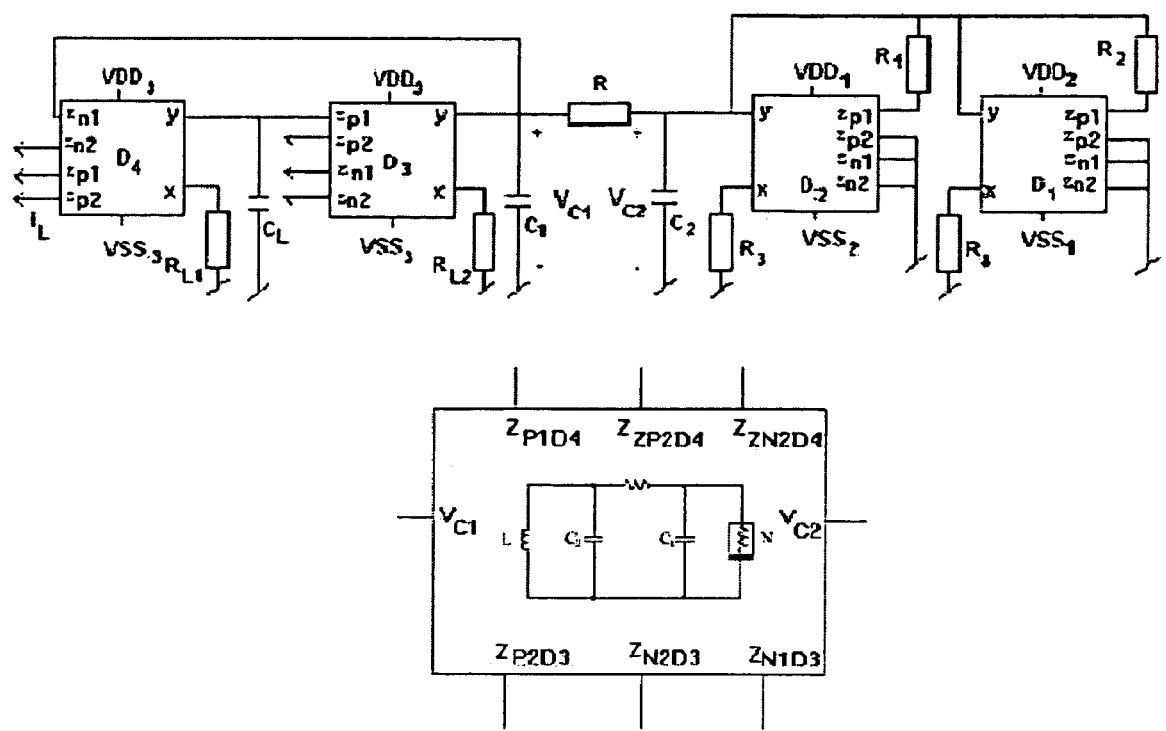
FIG. 11 is a schematic diagram of a Chua's circuit using the MO-CCII according to. the invention.

Similar results can be achieved by using the MO-CCII by replacing terminal x of the DO-CCII by terminal x of the MOCCII, terminal y of the DO-CCII by terminal y of the MOCCII, terminal z+ of the DO-CCII by terminal z1+ of the MOCCII, terminal z− of the DO-CCII by terminal z1− of the MO-CCII, terminal VDD of the DO-CCII by terminal VDD of the MO-CCII, terminal VSS of the DO-CCII by terminal VSS of the MO-CCII, and the rest of the terminals of the MO-CCII, i.e., terminals z2+ and z2− remain floating. Thus, the MO-CCII based Chua's circuit is also formed, as shown in FIG. 11.

As described earlier, the Chua's circuit can be coupled by using one voltage buffer and one floating resistor using the scheme presented in FIG. 2. It is actually solving the following equations of the system:

$$C_1 \frac{dv_{C_1}^{(1)}}{dt} = G(v_{C_2}^{(1)} - v_{C_1}^{(1)}) - f(v_{C_1}^{(1)})$$

$$C_2 \frac{dv_{C_2}^{(1)}}{dt} = G(v_{C_1}^{(1)} - v_{C_2}^{(1)}) + i_L^{(1)} + f(v_{C_1}^{(1)}) + \frac{1}{R_K}(v_{C_2}^{(2)} - v_{C_2}^{(1)})$$

$$L \frac{dv_L^{(1)}}{dt} = -v_{C_2}^{(1)}$$

$$C_1 \frac{dv_{C_1}^{(2)}}{dt} = G(v_{C_2}^{(2)} - v_{C_1}^{(2)}) - f(v_{C_1}^{(2)})$$

$$C_2 \frac{dv_{C_2}^{(2)}}{dt} = G(v_{C_1}^{(2)} - v_{C_2}^{(2)}) + i_L^{(2)} + f(v_{C_1}^{(2)}) + \frac{1}{R_K}(v_{C_2}^{(3)} - v_{C_2}^{(2)})$$

$$L \frac{dv_L^{(2)}}{dt} = -v_{C_2}^{(2)}$$

$$\vdots$$

$$C_1 \frac{dv_{C_1}^{(n)}}{dt} = G(v_{C_2}^{(n)} - v_{C_1}^{(n)}) - f(v_{C_1}^{(n)})$$

$$C_2 \frac{dv_{C_2}^{(n)}}{dt} = G(v_{C_1}^{(n)} - v_{C_2}^{(n)}) + i_L^{(n)} + f(v_{C_1}^{(n)}) + \frac{1}{R_K}(v_{C_2}^{(n+1)} - v_{C_2}^{(n)})$$

$$L \frac{dv_L^{(n)}}{dt} = -v_{C_2}^{(n)}$$

Here n is taken to be equal to 5. $R_K$ is the controlling resistor whose value describes the behavior of the entire system.

Figure 13:
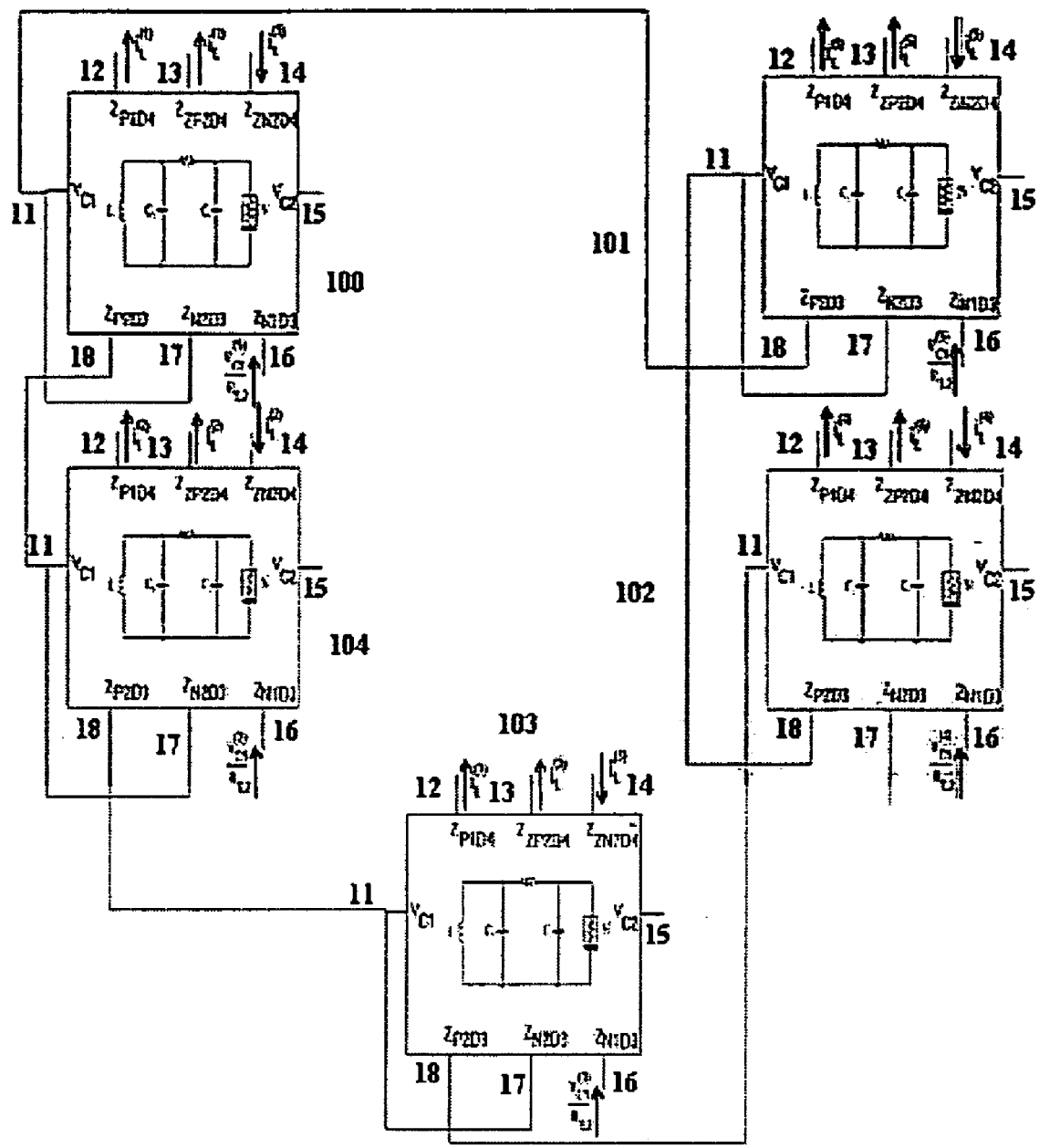
FIG. 13 is a schematic diagram of a MO-CCII based hyper-chaotic circuit according to the invention.

The invention tries to achieve the solution of the above equations without any additional hardware by proposing the scheme, as shown in FIG. 13.

Referring to FIG. 13, 11 of the Chua's circuit (100) is connected to 17 of the same Chua's circuit 100, 11 of the Chua's circuit (100) is also connected to 18 of a next Chua's circuit (101). Similarly, 18 of the Chua's circuit (100) is connected with 11 of a previous Chua's circuit (99), thereby forming a ring using several Chua's circuit connected in a similar and in a symmetric fashion. The resistor RL2 of each Chua's circuit acts as a controlling resistor, and the coupling is achieved without an additional resistor or voltage buffer. The additional advantage of this embodiment of a hyper-chaotic circuit is that the controlling resistor is grounded, and hence, can be beneficial in a straightforward monolithic implementation.

Figure 14:
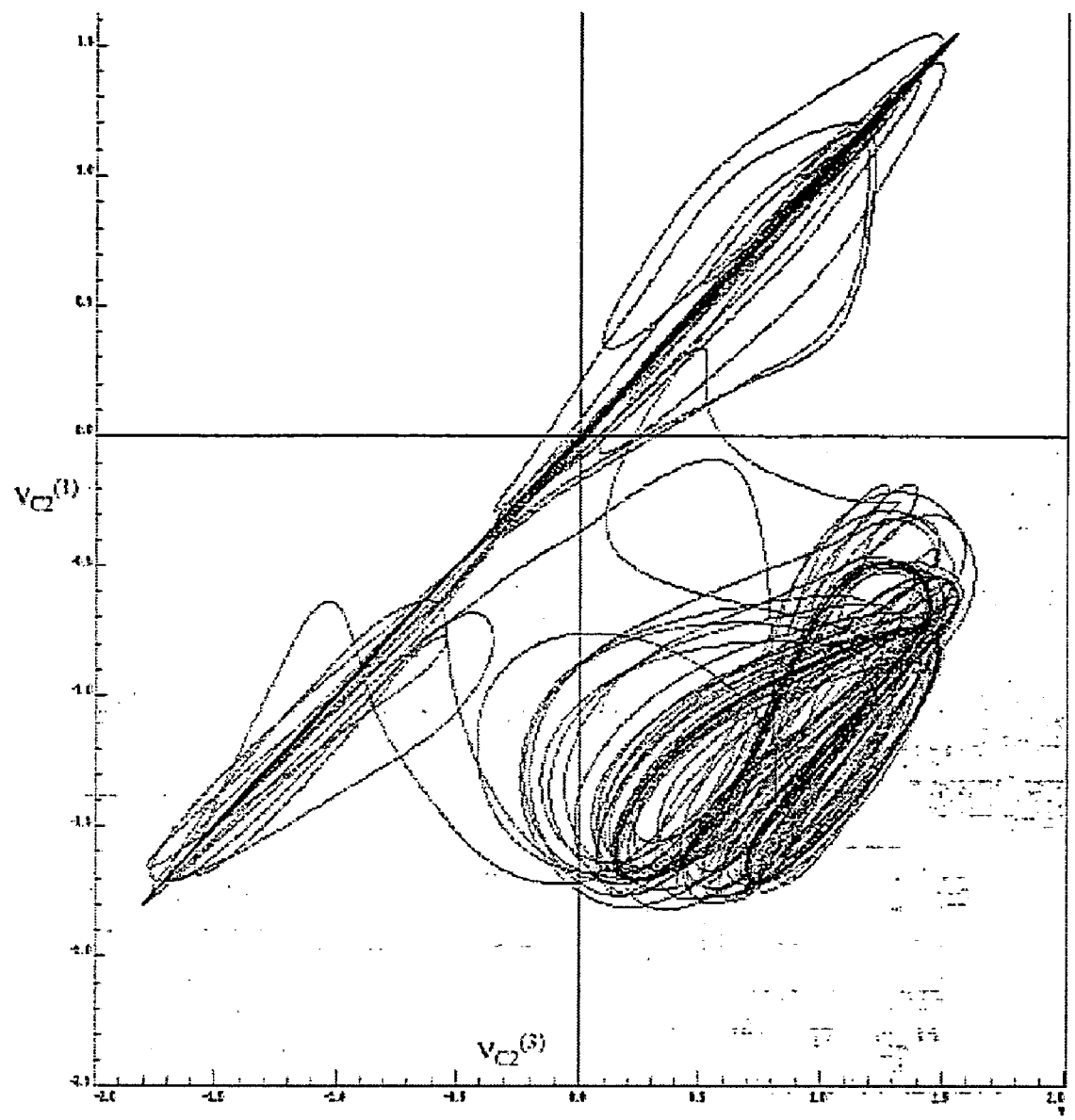
FIG. 14 is a plot showing simulation results of a hyper-chaotic circuit validating the theory according to the invention.

For the above stated values of components and with RL1=300 Ohm and RL2=600 ohm for a Chua's circuit designed using the MO-CCII and using a similar Chua's circuit for coupling with the scheme as shown in FIG. 13, the system of FIG. 13 thus derived is a hyper-chaotic circuit. This is proved by the fact that none of the Chua's circuits are in synchronization with each other as reflected by the simulation results shown in FIG. 14.

A DO-CCII/MO-CCII based implementation of a Chua's circuit is presented. The circuit has advantages of a grounded resistor and capacitor, minimum active and passive components and accessibility of current across the inductor. Moreover, apart from these advantages the voltage across the capacitor (of the tank circuit) is also available in the form of current at a high impedance node. One of the applications of this current is in generating a hyper-chaos coupled Chua's circuit with reduced hardware.

The Chua's circuit uses a DO-CCII/MO-CCII based inductor and non-linear component that allows tapping of current through the inductor and voltage across the capacitor of the tank circuit without requiring any additional hardware. The available third state variable can be observed, and therefore, it is possible to make more complex chaotic circuits using this additional information. Also, the inductor of the present invention does not use any additional components, such as capacitors and resistors as compared to the prior art.

The invention does not use operational amplifiers but instead it uses current conveyors to operate in the current mode. Also, the invention does not require a precise component matching unlike in the prior art that used op-amps for forming a Chua's circuit.

The invention also relates to the use of available current in designing a reduced hardware hyper-chaos circuit. The final hyper-chaotic circuit thus designed offers several advantages, such as minimum active and passive components for a coupled Chua's circuit, coupling of a Chua's circuit without additional hardware such as a voltage buffer and a floating resistor, a controlling resistor being grounded, etc. These advantages are non-existent when the same coupling is achieved using any of the prior art Chua's circuits.

I claim:

1. A Chua's circuit comprising;
   a multiple output current conveyer based inductor having a first inductor terminal connected to a voltage reference, and a second inductor terminal;
   a first capacitor connected to the second inductor terminal of said inductor;
   a resistor having a first terminal connected to the second inductor terminal of said inductor, and a second terminal;
   a second capacitor having a first terminal connected to the voltage reference, and a second terminal connected to the second terminal of said resistor; and
   a pair of multiple output current conveyers connected together to form a 2-terminal negative resistance having one terminal connected to the voltage reference, and a second terminal connected to the second terminal of said resistor.

2. A Chua's circuit according to claim 1 wherein the voltage reference comprises ground.

3. A Chua's circuit according to claim 1 wherein each multiple output current conveyer comprises a second generation multiple output current conveyer (MO-CCII).

4. A Chua's circuit according to claim 1 wherein said inductor comprises:
   first and second multiple output current conveyers, each multiple output current conveyer comprising a plurality of terminals including an x terminal, a y terminal, a $z_{P1}$ terminal and a $z_{N1}$ terminal,
   a first resistor connected between the x terminal of said first multiple output current conveyer and the voltage reference;
   a second resistor connected between the x terminal of said second multiple output current conveyer and the voltage reference; and
   a capacitor having a first terminal connected to the voltage reference, and a second terminal connected to the $z_{P1}$ terminal of said second multiple output current conveyer and in parallel to the y terminal of said first multiple output current conveyer while the y terminal of said second multiple output current conveyer and the $z_{N1}$ terminal of said first multiple output current conveyer are joined together to function as a terminal of a simulated grounded inductance.

5. A Chua's circuit according to claim 1 wherein said pair of multiple output current conveyers connected together to form the 2-terminal negative resistance comprises:
 first and second multiple output current conveyers, each multiple output current conveyer comprising a plurality of terminals including an x terminal, a y terminal, and a $z_{P1}$ terminal, with the y terminals of said first and second multiple output current conveyers connected together;
 a first resistor connected between the x terminal of said first multiple output current conveyer and the voltage reference;
 a second resistor connected between the x terminal of said second multiple output current conveyer and the voltage reference;
 a third resistor connected between the $z_{P1}$ terminal of said first multiple output current conveyer and the y terminal of said first and second multiple output current conveyers; and
 a fourth resistor connected between the $z_{P1}$ terminal of said second multiple output current conveyer and the y terminal of said first and second multiple output current conveyers.

6. A Chua's circuit comprising;
 a dual output current conveyer based inductor having a first inductor terminal connected to a voltage reference, and a second inductor terminal;
 a first capacitor connected to the second inductor terminal of said inductor;
 a resistor having a first terminal connected to the second inductor terminal of said inductor, and a second terminal;
 a second capacitor having a first terminal connected to the voltage reference, and a second terminal connected to the second terminal of said resistor; and
 a pair of dual output current conveyers connected together to form a 2-terminal negative resistance having one terminal connected to the voltage reference, and a second terminal connected to the second terminal of said resistor.

7. A Chua's circuit according to claim 6 wherein the voltage reference comprises ground.

8. A Chua's circuit according to claim 6 wherein each dual output current conveyer comprises a second generation dual output current conveyer (DO-CCII).

9. A Chua's circuit according to claim 6 wherein said inductor comprises:
 first and second dual output current conveyers, each multiple output current conveyer comprising a plurality of terminals including an x terminal, a y terminal, a $z_+$ terminal and a $z_-$ terminal,
 a first resistor connected between the x terminal of said first dual output current conveyer and the voltage reference;
 a second resistor connected between the x terminal of said second dual output current conveyer and the voltage reference; and
 a capacitor having a first terminal connected to the voltage reference, and a second terminal connected to the $z_+$ terminal of said second dual output current conveyer and in parallel to the y terminal of said first dual output current conveyer while the y terminal of said second dual output current conveyer and the $z_-$ terminal of said first dual output current conveyer are joined together to function as a terminal of a simulated grounded inductance.

10. A Chua's circuit according to claim 6 wherein said pair of dual output current conveyers connected together to form the 2-terminal negative resistance comprises:
 first and second dual output current conveyers, each dual output current conveyer comprising a plurality of terminals including an x terminal, a y terminal, and a $z_+$ terminal, with the y terminals of said first and second multiple output current conveyers connected together;
 a first resistor connected between the x terminal of said first dual output current conveyer and the voltage reference;
 a second resistor connected between the x terminal of said second dual output current conveyer and the voltage reference;
 a third resistor connected between the $z_+$ terminal of said first dual output current conveyer and the y terminal of said first and second dual output current conveyers; and
 a fourth resistor connected between the $z_+$ terminal of said dual multiple output current conveyer and the y terminal of said first and second dual output current conveyers.

11. A Chua's circuit according to claim 6 wherein the Chua's circuit is connected to a plurality of other Chua's circuit symmetrically coupled together for enabling a monolithic implementation of a hyper-chaotic circuit.

12. A method for making a Chua's circuit comprising:
 connecting a voltage reference to a first inductor terminal of a multiple output current conveyer based inductor;
 connecting a first capacitor to a second inductor terminal of the inductor;
 connecting a first terminal of a resistor to the second inductor terminal of the inductor;
 connecting a first terminal of a second capacitor to the voltage reference, and connecting a second terminal of the second capacitor to the second terminal of the resistor; and
 connecting a pair of multiple output current conveyers together to form a 2-terminal negative resistance having one terminal connected to the voltage reference, and a second terminal connected to the second terminal of the resistor.

13. A method according to claim 12 wherein the voltage reference comprises ground.

14. A method according to claim 12 wherein each multiple output current conveyer comprises a second generation multiple output current conveyer (MO-CCII).

15. A method according to claim 12 wherein the inductor comprises:
 first and second multiple output current conveyers, each multiple output current conveyer comprising a plurality of terminals including an x terminal, a y terminal, a $z_{P1}$ terminal and a $Z_{N1}$ terminal,
 a first resistor connected between the x terminal of the first multiple output current conveyer and the voltage reference;
 a second resistor connected between the x terminal of the second multiple output current conveyer and the voltage reference; and
 a capacitor having a first terminal connected to the voltage reference, and a second terminal connected to the $z_{P1}$ terminal of the second multiple output current conveyer and in parallel to the y terminal of the first multiple output current conveyer while the y terminal of the second multiple output current conveyer and the $Z_{N1}$ terminal of the first multiple output current conveyer are joined together to function as a terminal of a simulated grounded inductance.

16. A method according to claim 12 wherein the pair of multiple output current conveyers connected together to form the 2-terminal negative resistance comprises:

first and second multiple output current conveyers, each multiple output current conveyer comprising a plurality of terminals including an x terminal, a y terminal, and a $Z_{P1}$ terminal, with the y terminals of the first and second multiple output current conveyers connected together;

a first resistor connected between the x terminal of the first multiple output current conveyer and the voltage reference;

a second resistor connected between the x terminal of the second multiple output current conveyer and the voltage reference;

a third resistor connected between the $z_{P1}$ terminal of the first multiple output current conveyer and the y terminal of the first and second multiple output current conveyers; and a fourth resistor connected between the $z_{P1}$ terminal of the second multiple output current conveyer and the y terminal of the first and second multiple output current conveyers.

* * * * *

UNITED STATES PATENT AND TRADEMARK OFFICE
CERTIFICATE OF CORRECTION

PATENT NO. : 7,119,640 B2
APPLICATION NO. : 11/036411
DATED : October 10, 2006
INVENTOR(S) : Gandhi It is certified that error appears in the above-identified patent and that said Letters Patent is hereby corrected as shown below:

Column 1, Line 42   Delete: "$c_2$"
                    Insert: --$C_2$--

Column 2, Line 19   Delete: "0."
                    Insert: --O.--

Column 2, Line 34   Delete: "op-amp.',"
                    Insert: --op-amp',--

Column 3, Line 14   Delete: "loose"
                    Insert: --lose--

Column 5, Line 59   Delete: "to. the"
                    Insert: --to the--

Column 10, Line 30  Insert: -- $C_L R_{L1} R_{L2} \dfrac{di_L}{dt} = -V_1$ --

Column 12, Line 24  Delete: "comprising;"
                    Insert: --comprising:--

Column 13, Line 24  Delete: "comprising;"
                    Insert: --comprising:--

Signed and Sealed this

Seventh Day of August, 2007

JON W. DUDAS
*Director of the United States Patent and Trademark Office*